US009461357B2

(12) United States Patent
Pope et al.

(10) Patent No.: US 9,461,357 B2
(45) Date of Patent: Oct. 4, 2016

(54) ANTENNA ON SAPPHIRE STRUCTURE

(71) Applicant: Apple Inc., Cupertino, CA (US)

(72) Inventors: Benjamin J. Pope, Cupertino, CA (US); Scott A. Myers, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/956,799

(22) Filed: Dec. 2, 2015

(65) Prior Publication Data

US 2016/0087332 A1 Mar. 24, 2016

Related U.S. Application Data

(63) Continuation of application No. 14/178,623, filed on Feb. 12, 2014, now Pat. No. 9,225,056.

(51) Int. Cl.
*H01Q 1/24* (2006.01)
*H01Q 1/38* (2006.01)
*H01Q 7/00* (2006.01)
*H05K 3/10* (2006.01)
*H01Q 3/44* (2006.01)
*H01Q 3/26* (2006.01)

(52) U.S. Cl.
CPC ............ *H01Q 1/38* (2013.01); *H01Q 1/24* (2013.01); *H01Q 1/243* (2013.01); *H01Q 7/00* (2013.01); *H05K 3/10* (2013.01); *H01Q 3/26* (2013.01); *H01Q 3/44* (2013.01); *Y10T 29/49016* (2015.01)

(58) Field of Classification Search
CPC .......... H01Q 1/243; H01Q 3/44; H01Q 3/26; H01Q 1/38; H01Q 7/00
USPC ............... 343/702, 700, 853, 866, 867, 850
See application file for complete search history.

(56) References Cited

U.S. PATENT DOCUMENTS

| 2,248,955 A | 7/1941 | Capps |
| 2,854,794 A | 10/1958 | Luedeman |
| 3,208,070 A | 9/1965 | Boicey |
| 3,753,775 A | 8/1973 | Robinson et al. |
| 3,964,942 A | 6/1976 | Berkenblit et al. |

(Continued)

FOREIGN PATENT DOCUMENTS

| CN | 1400859 | 3/2003 |
| CN | 1930598 | 3/2007 |

(Continued)

OTHER PUBLICATIONS

Flores, Marc, "Can a Case Scratch the iPhone 4's Glass and Shatter it?," Oct. 8, 2010, pp. 1-10, retrieved from the internet: URL:http://www.intomobile.com/2010/10/08/glassgate-iphone-4.

(Continued)

*Primary Examiner* — Joseph Lauture
(74) *Attorney, Agent, or Firm* — Brownstein Hyatt Farber Schreck, LLP

(57) ABSTRACT

An antenna on a sapphire structure. The antenna includes a sapphire structure having a first side, and a second side positioned opposite the first side. The antenna also includes a first antenna trace positioned on the first side of the sapphire structure, and a second antenna trace positioned on the second side of the sapphire structure. Additionally, the antenna includes at least one via formed through the sapphire structure. The at least one via electrically connects the first antenna trace to the second antenna trace.

19 Claims, 9 Drawing Sheets

(56) References Cited

U.S. PATENT DOCUMENTS

| | | |
|---|---|---|
| 4,008,111 A | 2/1977 | Rutz |
| 4,054,895 A | 10/1977 | Ham |
| 4,070,211 A | 1/1978 | Harari |
| 4,085,302 A | 4/1978 | Zenk et al. |
| 4,339,300 A | 7/1982 | Noble |
| 4,393,578 A | 7/1983 | Cady et al. |
| 4,662,124 A | 5/1987 | Kato et al. |
| 4,732,867 A | 3/1988 | Schnable |
| 4,735,917 A | 4/1988 | Flatley et al. |
| 4,775,641 A | 10/1988 | Duffy et al. |
| 4,811,004 A | 3/1989 | Person et al. |
| 4,826,300 A | 5/1989 | Efron et al. |
| 4,849,299 A | 7/1989 | Loth |
| 4,908,074 A | 3/1990 | Hosoi et al. |
| 4,946,546 A | 8/1990 | Bourgeois |
| 5,005,020 A | 4/1991 | Ogawa et al. |
| 5,151,389 A | 9/1992 | Zappella |
| 5,154,023 A | 10/1992 | Sioshansi |
| 5,377,669 A | 1/1995 | Schulz |
| 5,413,360 A | 5/1995 | Atari et al. |
| 5,427,051 A | 6/1995 | Maxwell et al. |
| 5,441,591 A | 8/1995 | Imthurn et al. |
| 5,451,553 A | 9/1995 | Scott et al. |
| 5,543,630 A | 8/1996 | Bliss et al. |
| 5,549,746 A | 8/1996 | Scott et al. |
| 5,627,109 A | 5/1997 | Sassa et al. |
| 5,661,313 A | 8/1997 | Dubbelday et al. |
| 5,697,998 A | 12/1997 | Platus et al. |
| 5,702,654 A | 12/1997 | Chen et al. |
| 5,792,298 A | 8/1998 | Sauer et al. |
| 5,804,522 A | 9/1998 | Uegami |
| 5,852,622 A | 12/1998 | Meissner et al. |
| 5,877,094 A | 3/1999 | Egley et al. |
| 6,025,060 A | 2/2000 | Meissner et al. |
| 6,028,711 A | 2/2000 | Adachi |
| 6,028,762 A | 2/2000 | Kamitani |
| 6,030,849 A | 2/2000 | Hasegawa et al. |
| 6,038,079 A | 3/2000 | Michaels |
| 6,123,026 A | 9/2000 | Gottlieb |
| 6,265,089 B1 | 7/2001 | Fatemi et al. |
| 6,275,157 B1 | 8/2001 | Mays et al. |
| 6,379,985 B1 | 4/2002 | Cervantes et al. |
| 6,406,769 B1 | 6/2002 | Delabre |
| 6,424,017 B2 | 7/2002 | Kurtz et al. |
| 6,483,237 B2 | 11/2002 | Eastlund et al. |
| 6,489,221 B2 | 12/2002 | Gehrke et al. |
| 6,547,722 B1 | 4/2003 | Higuma |
| 6,586,819 B2 | 7/2003 | Matsuoka |
| 6,642,989 B2 | 11/2003 | Umehara et al. |
| 6,677,906 B2 | 1/2004 | Quinn et al. |
| 6,775,073 B2 | 8/2004 | Fukazawa |
| 6,818,532 B2 | 11/2004 | Moeggenborg et al. |
| 6,819,693 B2 | 11/2004 | Derriey et al. |
| 6,849,524 B2 | 2/2005 | Shelton et al. |
| 6,852,253 B2 | 2/2005 | Tomioka |
| 6,853,336 B2 | 2/2005 | Asano et al. |
| 6,858,274 B2 | 2/2005 | Fukazawa |
| 6,872,108 B2 | 3/2005 | Hsu |
| 6,875,099 B2 | 4/2005 | Tatartchenko et al. |
| 6,911,375 B2 | 6/2005 | Mack, III et al. |
| 7,018,709 B2 | 3/2006 | Stevenson et al. |
| 7,030,417 B2 | 4/2006 | Bakshi et al. |
| 7,074,652 B2 | 7/2006 | Kumaran et al. |
| 7,128,846 B2 | 10/2006 | Gaudin et al. |
| 7,142,433 B2 | 11/2006 | Lechner |
| 7,151,045 B2 | 12/2006 | Hasegawa et al. |
| 7,171,290 B2 | 1/2007 | Morinaga et al. |
| 7,208,096 B2 | 4/2007 | Cherian et al. |
| 7,255,740 B2 | 8/2007 | Sprenger et al. |
| 7,271,769 B2 | 9/2007 | Asano et al. |
| 7,390,702 B2 | 6/2008 | Nakamura |
| 7,495,615 B2 | 2/2009 | Yamanaka et al. |
| 7,499,093 B2 | 3/2009 | Campbell |
| 7,561,351 B2 | 7/2009 | Konno |
| 7,616,951 B2 | 11/2009 | Chang et al. |
| 7,619,567 B2 | 11/2009 | Lynch et al. |
| 7,663,189 B2 | 2/2010 | Fukuda |
| 7,683,838 B2 | 3/2010 | Koyama et al. |
| 7,704,321 B2 | 4/2010 | Riman et al. |
| 7,803,451 B2 | 9/2010 | Lee et al. |
| 7,807,549 B2 | 10/2010 | Tong et al. |
| 7,883,557 B2 | 2/2011 | Liu et al. |
| 7,902,474 B2 | 3/2011 | Mittleman et al. |
| 7,943,953 B2 | 5/2011 | Sakamoto et al. |
| 7,956,356 B2 | 6/2011 | Tanikella et al. |
| 7,966,785 B2 | 6/2011 | Zadesky et al. |
| 7,977,587 B2 | 7/2011 | Rajagopal et al. |
| 7,983,721 B2 | 7/2011 | Ying et al. |
| 8,003,189 B2 | 8/2011 | Jones et al. |
| 8,009,441 B2 | 8/2011 | Clancy et al. |
| 8,157,912 B2 | 4/2012 | Wei |
| 8,158,900 B2 | 4/2012 | Maatta |
| 8,197,303 B2 | 6/2012 | Tanikella et al. |
| 8,268,656 B2 | 9/2012 | Kajiyama |
| 8,350,766 B2 | 1/2013 | Hisaeda et al. |
| 8,390,023 B2 | 3/2013 | Armitage et al. |
| 8,455,879 B2 | 6/2013 | Tanikella et al. |
| 8,665,235 B2 | 3/2014 | Tang et al. |
| 8,721,917 B2 | 5/2014 | Cherian et al. |
| 8,922,434 B2 | 12/2014 | Prat et al. |
| 8,971,963 B2 | 3/2015 | Tsai |
| 2002/0017653 A1 | 2/2002 | Chuang |
| 2002/0111194 A1 | 8/2002 | Behbahani et al. |
| 2002/0167068 A1 | 11/2002 | Hsu et al. |
| 2002/0168837 A1 | 11/2002 | Hsu et al. |
| 2006/0003587 A1 | 1/2006 | Hsu et al. |
| 2006/0043396 A1 | 3/2006 | Tsuda et al. |
| 2006/0055619 A1* | 3/2006 | Sarabandi ............. H01Q 7/00 343/866 |
| 2006/0162849 A1 | 7/2006 | Han |
| 2006/0196849 A1 | 9/2006 | Moeggenborg et al. |
| 2007/0204493 A1 | 9/2007 | Foley et al. |
| 2008/0075941 A1 | 3/2008 | Tatartchenko et al. |
| 2008/0145632 A1 | 6/2008 | Nagami |
| 2008/0264767 A1 | 10/2008 | Chen et al. |
| 2009/0098807 A1 | 4/2009 | Bakshi et al. |
| 2009/0104409 A1 | 4/2009 | Derriey et al. |
| 2009/0130415 A1 | 5/2009 | Mack, III et al. |
| 2009/0268019 A1 | 10/2009 | Ishii |
| 2009/0321234 A1 | 12/2009 | Yu et al. |
| 2010/0092728 A1 | 4/2010 | Hasegawa et al. |
| 2011/0019123 A1 | 1/2011 | Prest et al. |
| 2011/0019354 A1 | 1/2011 | Prest et al. |
| 2011/0062394 A1 | 3/2011 | Kumaran et al. |
| 2011/0177300 A1 | 7/2011 | Hankey et al. |
| 2011/0195560 A1 | 8/2011 | Gaudin et al. |
| 2011/0223840 A1 | 9/2011 | Morinaga et al. |
| 2012/0038471 A1 | 2/2012 | Kim et al. |
| 2012/0088099 A1 | 4/2012 | Tosatti et al. |
| 2012/0118228 A1 | 5/2012 | Lee et al. |
| 2012/0135177 A1 | 5/2012 | Cornejo et al. |
| 2012/0212890 A1 | 8/2012 | Hoshino et al. |
| 2012/0229424 A1 | 9/2012 | Behles et al. |
| 2013/0082895 A1 | 4/2013 | Shiu et al. |
| 2013/0102359 A1 | 4/2013 | Ho |
| 2013/0237402 A1 | 9/2013 | Wang et al. |
| 2015/0085429 A1 | 3/2015 | Memering et al. |
| 2015/0085432 A1 | 3/2015 | Memering et al. |
| 2016/0062405 A1 | 3/2016 | Mylvaganam et al. |
| 2016/0064800 A1 | 3/2016 | de Jong et al. |
| 2016/0087332 A1 | 3/2016 | Pope et al. |

FOREIGN PATENT DOCUMENTS

| | | |
|---|---|---|
| CN | 101342887 | 1/2009 |
| CN | 103052286 | 4/2013 |
| CN | 103096649 | 5/2013 |
| DE | 202008002512 | 6/2008 |
| EP | 0305626 | 3/1989 |
| EP | 1013802 | 6/2000 |
| EP | 1829846 | 9/2007 |
| EP | 1868263 | 12/2007 |
| EP | 2424034 | 2/2012 |
| GB | 1135886 | 12/1968 |

(56) References Cited

FOREIGN PATENT DOCUMENTS

| | | |
|---|---|---|
| GB | 2471161 | 12/2010 |
| JP | 54032062 | 3/1979 |
| JP | 1173764 | 7/1989 |
| JP | 2039578 | 2/1990 |
| JP | 3021048 | 1/1991 |
| JP | 03115200 | 5/1991 |
| JP | 3177335 | 8/1991 |
| JP | 3250659 | 11/1991 |
| JP | 5027257 | 2/1993 |
| JP | 5085894 | 4/1993 |
| JP | 5343103 | 11/1993 |
| JP | 5333164 | 12/1993 |
| JP | 5335435 | 12/1993 |
| JP | 06242260 | 9/1994 |
| JP | 6314694 | 11/1994 |
| JP | 06337292 | 12/1994 |
| JP | 7129952 | 5/1995 |
| JP | 07145000 | 6/1995 |
| JP | 8040797 | 2/1996 |
| JP | 8148594 | 6/1996 |
| JP | 09008690 | 1/1997 |
| JP | 9213773 | 8/1997 |
| JP | 9270565 | 10/1997 |
| JP | 9295895 | 11/1997 |
| JP | 10239520 | 9/1998 |
| JP | 10269543 | 10/1998 |
| JP | 10275955 | 10/1998 |
| JP | 10335259 | 12/1998 |
| JP | 11135889 | 5/1999 |
| JP | 2000183203 | 6/2000 |
| JP | 2000196149 | 7/2000 |
| JP | 2001134927 | 5/2001 |
| JP | 2001176993 | 6/2001 |
| JP | 2001237335 | 8/2001 |
| JP | 2001298170 | 10/2001 |
| JP | 2002015977 | 1/2002 |
| JP | 2002109854 | 4/2002 |
| JP | 2002184845 | 6/2002 |
| JP | 2002201096 | 7/2002 |
| JP | 2002255694 | 9/2002 |
| JP | 2002289529 | 10/2002 |
| JP | 2002293692 | 10/2002 |
| JP | 2003015156 | 1/2003 |
| JP | 2003069176 | 3/2003 |
| JP | 2003133802 | 5/2003 |
| JP | 2003137690 | 5/2003 |
| JP | 2003245847 | 9/2003 |
| JP | 2003277194 | 10/2003 |
| JP | 2003282551 | 10/2003 |
| JP | 2003332234 | 11/2003 |
| JP | 2004111848 | 4/2004 |
| JP | 2004168622 | 6/2004 |
| JP | 2004288934 | 10/2004 |
| JP | 2004296575 | 10/2004 |
| JP | 2004296701 | 10/2004 |
| JP | 2004296912 | 10/2004 |
| JP | 2005047718 | 2/2005 |
| JP | 2005064492 | 3/2005 |
| JP | 2005079171 | 3/2005 |
| JP | 2005085888 | 3/2005 |
| JP | 2005101230 | 4/2005 |
| JP | 2005104742 | 4/2005 |
| JP | 2005136106 | 5/2005 |
| JP | 2005277334 | 10/2005 |
| JP | 2005285869 | 10/2005 |
| JP | 2005314121 | 11/2005 |
| JP | 2006016230 | 1/2006 |
| JP | 2006016239 | 1/2006 |
| JP | 2006062931 | 3/2006 |
| JP | 2006066442 | 3/2006 |
| JP | 2006232639 | 9/2006 |
| JP | 2006232640 | 9/2006 |
| JP | 2006339308 | 12/2006 |
| JP | 2007150072 | 6/2007 |
| JP | 2007237627 | 9/2007 |
| JP | 2007237628 | 9/2007 |
| JP | 2007269577 | 10/2007 |
| JP | 2008111984 | 5/2008 |
| JP | 2008211040 | 9/2008 |
| JP | 2008297150 | 12/2008 |
| JP | 2009263534 | 11/2009 |
| JP | 2010056485 | 3/2010 |
| KR | 20100090897 | 8/2010 |
| WO | WO98/56575 | 12/1998 |
| WO | WO02/054718 | 7/2002 |
| WO | WO2004/059731 | 7/2004 |
| WO | WO2006/043685 | 4/2006 |
| WO | WO2007/143480 | 12/2007 |
| WO | WO2008/036888 | 3/2008 |
| WO | WO2008/122296 | 10/2008 |
| WO | WO2009/025842 | 2/2009 |
| WO | WO2009/151160 | 12/2009 |
| WO | WO2010/057842 | 2/2010 |

OTHER PUBLICATIONS

Quick, Darren, "Aston Martin teams with Mobiado for transparent touchscreen concept phone," Mar. 28, 2011, pp. 1-5, retrieved from the internet: URL:http://www-gizmag.com/cpt002-aston-martin-concept-phone/18248.

Schmid et al., "Effect of Crystal Orientation and Temperature on the Strength of Sapphire," J.Am.Ceram.Soc., 81, 1998, pp. 885-893.

Sykes, Neil, "The Use of Lasers in Target Manufacture," 2010, pp. 1-24, retrieved from the internet: URL:heep://www.stfc.ac.uk/CLF/resources/PDF/events_3effw_weds_sykes.pdf.

Zahler, James, "Sapphire and GaN Substrate Materials," DOE SSL Manufacturing R&D Workshop 2012, Presentation, Apr. 14, 2012, pp. 1-19.

* cited by examiner

ANTENNA ON SAPPHIRE STRUCTURE

CROSS-REFERENCE TO RELATED APPLICATION

This application is a continuation patent application of U.S. Non-provisional patent application Ser. No. 14/178,623, filed Feb. 12, 2014, and titled "Antenna on Sapphire Structure," the disclosure of which is hereby incorporated herein by reference in its entirety.

FIELD

The disclosure relates generally to electronic devices, and more particularly, to electronic device antennas formed on sapphire structures and methods for forming the antennas on sapphire structures.

BACKGROUND

Conventional electronic devices typically include a plurality of wireless communication systems for transmitting data. For example, where the electronic device includes a cellular telephone, the device may include variety of wireless communication systems including: a cellular communication system, a local area communication system, a Wifi system, a Bluetooth system and a near field communication (NFC) system. These conventional wireless communication systems typically include antennas used to transmit data. That is, the wireless communication systems included within the electronic device typically rely on antennas to send and receive information or data specific to the wireless communication system utilizing the antenna. As a result of conventional electronic devices including a plurality of wireless communication systems, the electronic device may typically include a plurality of antennas, distinct to each wireless communication system.

For example, most conventional electronic devices include NFC systems, which allow electronic devices to wirelessly share and/or transmit data to distinct electronic devices. That is, the NFC system allows the wireless sharing of data between electronic devices that are contacting or within close proximity to one another. Conventional NFC systems utilize flexible printed circuits (FPC) in combination with coil antennas for transmitting the data between electronic devices. The FPC typically include multiple layers, that are laminated together, to electrically couple the antennas and/or other components of the NFC system included on the FPC. Additionally, the FPC typically includes a layer of ferrite material positioned adjacent the FPC to prevent interference between the antenna of the FPC and other components of the electronic device. As a result of the laminated, multi-layer construction of the FPC, and the inclusion of a layer of ferrite material, the FPC can occupy a large amount of space within the housing of the electronic device.

Additionally, the FPC used in conventional NFC systems typically lack structural integrity. That is, the FPC include substantially flexible properties, which adds further processing and/or operational risks when utilizing an FPC in an NFC system of an electronic device. For example, when installing an FPC in an electronic device, the FPC may require additional components to substantially fix the FPC within the housing of the electronic device. As such, the components used to fix the FPC may require even more space within the housing of the electronic device. Additionally, where the FPC is loosened or floating within the housing of the electronic device, undesirable flexion of the FPC may disconnect the FPC from other components of the electronic device, or may disrupt the connection of the components (e.g., antenna) on the PFC.

SUMMARY

Generally, embodiments discussed herein are related to electronic device antennas formed on sapphire structures and methods for forming the antennas on sapphire structures. The antenna may include antenna traces formed on distinct sides of a sapphire structure, where the respective traces are in electronic communication with one another by a plurality of vias formed in the sapphire structure or through doping the sapphire structure. By utilizing a sapphire structure to form the antenna of a wireless communication system in an electronic device, the overall size of the antenna may be substantially reduced. That is, as single sapphire structure may be used to form the antenna. By reducing the size of the antenna, the space required for the antenna within the enclosure of the electronic device may also be substantially reduced, and may allow more space within the enclosure for other components of the electronic device (for example, providing additional space for a battery).

Additionally, the sapphire structure of the antenna may include a custom configuration (e.g., shape). As a result of the custom configuration, the antenna may be placed in a variety of places within the enclosure of the electronic device and/or may include an increased area for the antenna. Furthermore, by forming the antenna on the sapphire structure, where the sapphire structure is substantially rigid, the antenna may be more easily fixed within the enclosure of the electronic device and/or may substantially prevent disconnection of the antenna from other components of the electronic device and/or disruption of the traces on the sapphire structure.

One embodiment may include an antenna. The antenna may be formed on, or include, a sapphire structure having a first side, and a second side positioned opposite the first side. The antenna may also include a first antenna trace positioned on the first side of the sapphire structure, and a second antenna trace positioned on the second side of the sapphire structure. Additionally, the antenna may include at least one via formed through the sapphire structure. The at least one via may electrically couple the first antenna trace to the second antenna trace.

A further embodiment may include an electronic device. The electronic device may include a enclosure, and an antenna coupled to the enclosure. The antenna may include: a sapphire structure, a first antenna trace positioned on the sapphire structure, and a second antenna trace positioned on sapphire structure opposite the first antenna trace. The first antenna trace may be electrically coupled to the second antenna trace.

Another embodiment may include a method of forming an antenna on a sapphire structure. The method may include providing a sapphire structure. The provided sapphire structure may include: a first side, and a second side positioned opposite the first side. The method may also include depositing a conductive material on the first side of the sapphire structure to form a first antenna trace, and depositing the conductive material on the second side of the sapphire structure to form a second antenna trace. Additionally, the method may include electrically coupling the first antenna trace of the sapphire structure to the second antenna trace of the sapphire structure.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
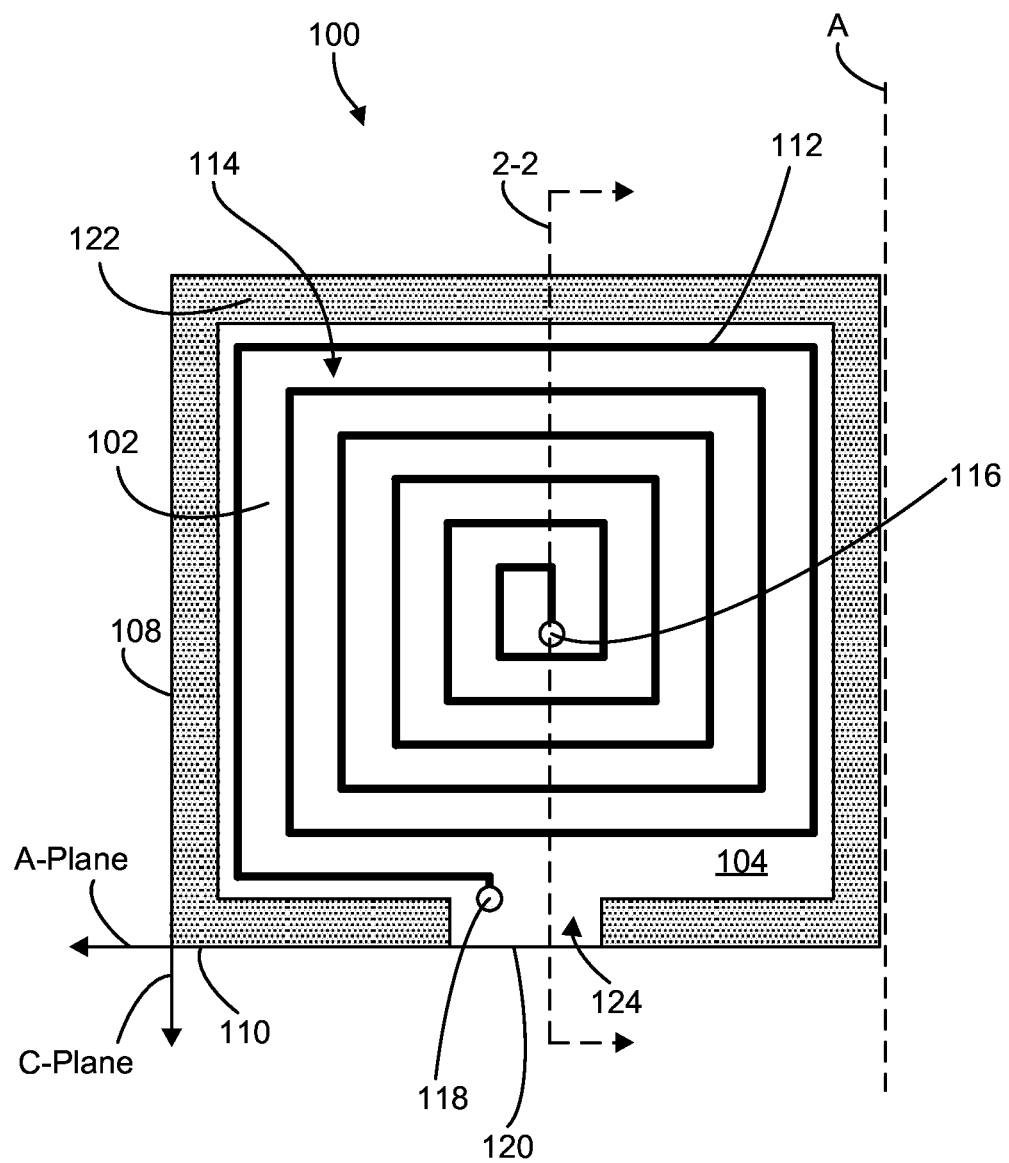
FIG. 1A shows an illustrative plane view of an antenna formed on a sapphire structure, according to embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to electronic devices, and more particularly, to electronic device antennas formed on sapphire structures and methods for forming the antennas on sapphire structures.

In a particular embodiment an antenna may include electrical traces formed on distinct sides of a sapphire structure, where the respective traces are in electronic communication with one another through one or more vias formed in the sapphire structure or through doping the sapphire structure. By utilizing a sapphire structure to form the antenna of a wireless communication system in an electronic device, the overall size of the antenna may be substantially reduced. That is, a single sapphire structure may be used to form the antenna. By reducing the size of the antenna, the required space for the antenna within the enclosure of the electronic device may also be substantially reduced, and may allow more space within the enclosure for other components of the electronic device (such as a battery, electrical circuit or other component). Additionally, the sapphire structure of the antenna may include a custom configuration, such as a custom shape. As a result of the custom configuration, the antenna may be placed in a variety of places within the enclosure of the electronic device and/or may include an increased area for the antenna. Furthermore, by forming the antenna on the sapphire structure, where the sapphire structure is substantially rigid, the antenna may be more easily fixed within the enclosure of the electronic device and/or may substantially prevent disconnection of the antenna from other components of the electronic device and/or disruption of the traces on the sapphire structure.

One sample, non-limiting antenna may include a sapphire structure including: a first side, and a second side positioned opposite the first side. The antenna may also include a first antenna trace positioned on the first side of the sapphire structure, and a second antenna trace positioned on the second side of the sapphire structure. Additionally, the antenna may include at least one via formed through the sapphire structure. The at least one via may electrically couple the first antenna trace to the second antenna trace.

A sample, non-limiting electronic device may include an enclosure, and an antenna coupled to the enclosure. The antenna may include: a sapphire structure, a first antenna trace positioned on the sapphire structure, and a second antenna trace positioned on sapphire structure opposite the first antenna trace. The first antenna trace may be electrically coupled to the second antenna trace.

A sample, non-limiting method forming an antenna on a sapphire structure may include providing a sapphire structure. The provided sapphire structure may include: a first side, and a second side positioned opposite the first side. The method may also include depositing a conductive material on the first side of the sapphire structure to form a first antenna trace, and depositing the conductive material on the second side of the sapphire structure to form a second antenna trace. Additionally, the method may include electrically coupling the first antenna trace of the sapphire structure to the second antenna trace of the sapphire structure.

These and other embodiments are discussed below with reference to FIGS. 1-8. However, those skilled in the art will readily appreciate that the detailed description given herein with respect to these Figures is for explanatory purposes only and should not be construed as limiting.

Figure 1B:
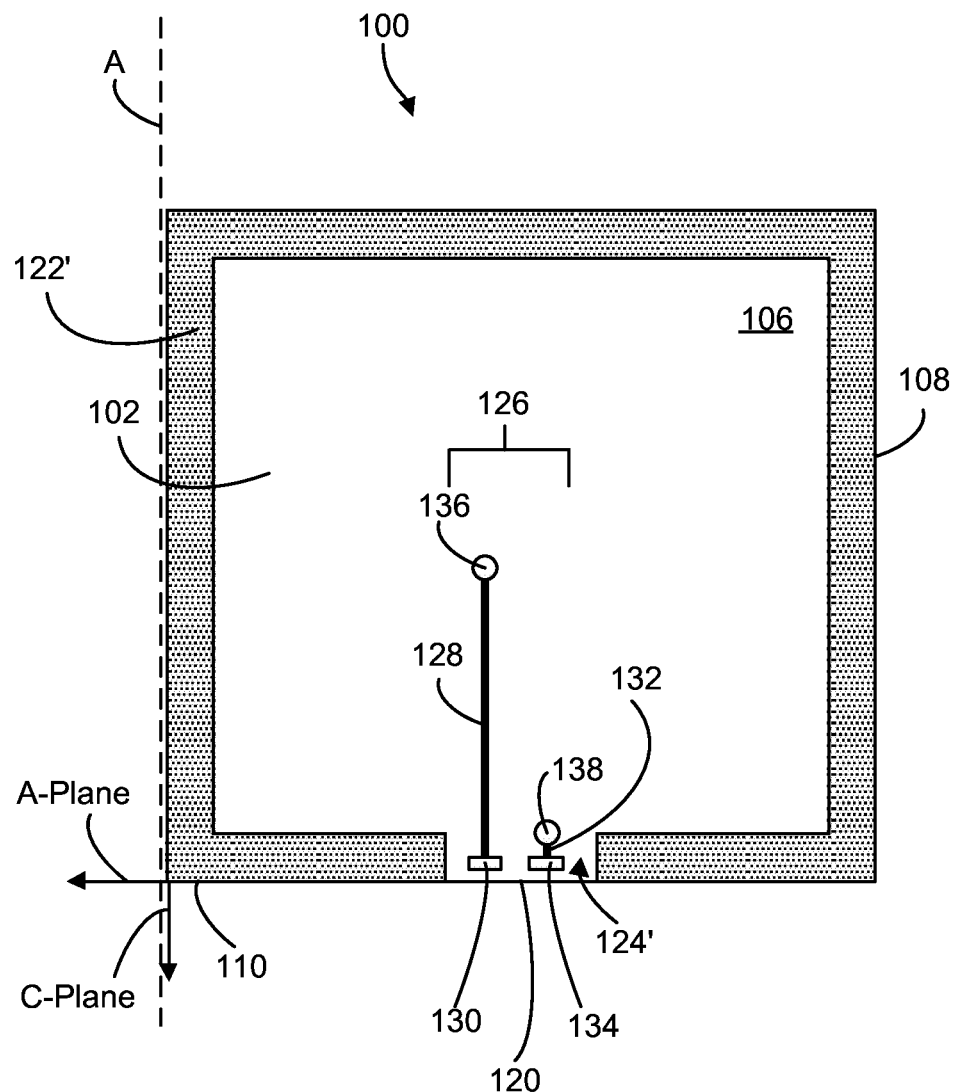
FIG. 1B shows an illustrative bottom view of the antenna formed on the sapphire structure of FIG. 1A, according to embodiments.

Referring now to FIGS. 1A and 1B a plane and bottom view, respectively, of one example of an antenna 100 on a sapphire structure 102 is shown. Sapphire structure 102 may include a pre-cut piece of artificially grown corundum. That is, sapphire structure 102, as shown in FIGS. 1A and 1B may include a custom configured portion of sapphire, formed from a large, artificially grown piece of corundum. The artificially grown corundum used to form sapphire structure 102 may be grown using any conventional growth process including, but not limited to: hydrothermal growth; vertical horizontal gradient freezing ("VHGF"); edge-defined film-fed growth ("EFG"); horizontal moving growth (e.g., Bridgman growth); and Kyropoulos growth.

Sapphire structure 102 may include a first side 104 (FIG. 1A) and a second side 106 (FIG. 1B) positioned opposite or adjacent first side 104. Sapphire structure 102 of antenna 100, as shown in FIG. 1B, may illustrate second side 106 by flipping or turning sapphire structure 102 including first side 104 of FIG. 1A about axis A. In a non-limiting example, as shown in FIG. 1A, first side 104 may include a top surface for sapphire structure 102, and second side 106 of FIG. 1B may include a bottom surface of sapphire structure 102, where the top surface and bottom surface are positioned opposite one another on sapphire structure 102. However, first side 104 and second side 106 may include other portions of sapphire structure 102. For example, in alternative embodiments, first side 104 and/or second side 106 may include adjacent/opposite sidewalls 108, 110, a top or bottom surface and sidewall 108, 110, and any other combination of portions making up sapphire structure 102.

As shown in FIGS. 1A and 1B, sapphire structure 102 may also include a plurality of plane orientations for the surfaces of sapphire structure 102. More specifically, each of the surfaces of sapphire structure 102 may be in alignment with a crystallographic plane orientation determined by the formation of sapphire structure 102. For example, as shown in FIG. 1A, sidewalls 108 of sapphire structure 102 may include an A-plane crystallographic orientation, while sidewalls 110 may include a C-plane crystallographic orientation. The crystallographic plane orientation of sapphire structure 102 used to form antenna 100 may affect the properties of antenna 100. That is, depending upon the crystallographic plane orientation of sapphire structure 102, the physical properties for antenna 100 may be distinct. In a non-limiting example, sapphire structure 102 may include first side 104 in an M-plane crystallographic plane orientation. As a result of first side being formed in an M-plane crystallographic plane orientation, sapphire structure 102 may include a substantially strong or rigid structure that may not be susceptible to deformation (for example, twisting). As such, and as discussed herein, because of sapphire structures 102 substantially rigid structure, sapphire structure may include a substantially reduced thickness compared to conventional antenna components.

It is understood that corundum (e.g., sapphire) is an anisotropic material. As a result, the crystallographic orientation of the surfaces of components made from corundum or sapphire (e.g., sapphire structure 102) may affect the physical properties and/or material characteristics (e.g., strength, ductility, elasticity) of the component. Additionally, the crystallographic orientation of sapphire structure 102 may also affect the electrical properties (e.g., radiofrequency (RF) properties, RF field) of the wireless communication system utilizing antenna 100, as discussed herein. It is also understood that the crystallographic orientation of the various surfaces may be dependent on the growing processes used for creating the corundum of sapphire structure 102 and/or the cutting process for forming sapphire structure 102 from the corundum. For example, the corundum from which sapphire structure 102 is formed may be grown using an EFG growth process. In the growth process, the seed crystal may include a plane orientation to yield corundum that may allow for specific, desired planes (e.g., C-plane, A-plane) to be utilized in components formed from the corundum (e.g., sapphire structure 102). By knowing the orientation of the seed crystal used in the EFG growth process, and ultimately knowing the crystallographic orientation of the grown corundum, manufactures can cut the corundum in a specific direction to form components with surfaces having specific plane crystallographic orientations, or substantially desirable plane crystallographic orientations.

Antenna 100 may include a first antenna trace 112 positioned on sapphire structure 102. More specifically, as shown in FIG. 1A, first antenna trace 112 of antenna 100 may be positioned on first side 104 of sapphire structure 102. First antenna trace 112 may for one or more loops on first side 104 of sapphire structure 102. That is, first antenna trace 112 positioned on first side 104 of sapphire structure 102 may include a multi-loop pattern 114. In a non-limiting example, as shown in FIG. 1A, first antenna trace 112 may include six (6) loops of conductive material for forming a portion of antenna 100. It is understood that first antenna trace 112, as shown in FIG. 1A is merely exemplary, and in other embodiments first antenna trace 112 may include a single loop pattern or a plurality of loops of conductive material for forming antenna 100. The conductive material forming first antenna trace 112 may include any material including electrically conductive properties including, but not limited to: copper, aluminum and indium tin oxide (ITO).

As shown in FIG. 1A, first antenna trace 112 of antenna 100 may include a first end 116 and second end 118 positioned opposite first end 116. More specifically, first end 116 may be positioned substantially within and/or may be substantially surrounded by the multi-loop pattern 114 of first antenna trace 112, and may be positioned adjacent the center of sapphire structure 102. Second end 118 may be positioned substantially outside of multi-loop pattern 114 of first antenna trace 112. Second end 118 may also be positioned adjacent or within proximity of an exposed edge 120 of sapphire structure 102. As shown in FIG. 1A, first end 116 and second end 118 may not be aligned on first side 104 of sapphire structure 102. That is, and as discussed herein, first end 116 and second end 118 of first antenna trace 112 may be separated to not interfere with additional connection points of antenna 100 used to couple and/or electrically connect antenna 100 to the wireless communication system utilizing antenna 100 and/or additional components of the electronic device (see, FIG. 4) including antenna 100.

Antenna 100 may also include a ground element 122 positioned on first side 104 of sapphire structure 102. More specifically, as shown in FIG. 1A, ground element 122 may be positioned on first side 104, substantially adjacent to and/or surrounding first antenna trace 112. Ground element 122 may be positioned adjacent sidewalls 108, 110 of sapphire structure 102, and may include at least one break or opening 124 to form exposed edge 120 of sapphire structure 102. That is, ground element 122 may substantially surround first antenna trace 112, but may include opening 124 to form exposed edge 120, where second end 118 of first antenna trace 112 may be positioned within opening 124 of ground element 122, proximate to exposed edge 120. As discussed herein, ground element 122 of antenna 100 may be electrically coupled to the electronic device (see, FIG. 4) for substantially grounding antenna 100 during operation within the electronic device.

Turning to FIG. 1B, antenna 100 may also include a second antenna trace 126 positioned on sapphire structure 102 opposite first antenna trace 112. That is, second antenna trace 126 may be positioned on second side 106 of sapphire structure 102, opposite first antenna trace 112 positioned on first side 104. Second antenna trace 126 may include two distinct lines of a conductive material formed on second side 106. More specifically, second antenna trace 126 may include a first contact line 128 including a first contact pad 130, and a second contact line 132 including a second contact pad 134, wherein second contact line 132 is distinct from first contact line 128. As shown in FIG. 1B, first contact pad 130 and second contact pad 134 may be positioned substantially adjacent to exposed edge 120 of sapphire structure 102. That is, first contact pad 130 and second contact pad 134 may be positioned within opening 124' formed in ground element 122' of second side 106, adjacent to exposed edge 120. As shown in FIG. 1B, ground element 122' may be positioned on second side 106 of sapphire structure 102, adjacent and/or substantially surrounding second antenna trace 126. Ground element 122' and opening 124' of second side 106 may be substantially similar to ground element 122 and opening 124 of first side 104. As such, redundant explanation of these components is omitted for clarity.

First contact pad 130 and second contact pad 134 may be separated by a distance equal to the distance separating first end 116 and second end 118 of first antenna trace 112, as shown in FIG. 1A. As discussed herein, first contact pad 130 and second contact pad 134 may be configured to electrically connect antenna 100 to the wireless communication system utilizing antenna 100 and/or additional components of the electronic device (see, for example, FIG. 4). That is, and as discussed herein, first contact pad 130 and second contact pad 134 of second antenna trace 126 may contact distinct components, circuitries or systems that may utilize antenna 100 during the operation of the electronic device (see, for example, FIG. 4).

The conductive material forming first contact line 128 and second contact line 132 of second antenna trace 126 may include any material including electrically conductive properties similar to the conductive material used to form first antenna trace 112. That is, the conductive material used to form second antenna trace 126 may include, but is not limited to: copper, aluminum and indium tin oxide (ITO). The conductive material used to form first antenna trace 112 (see, FIG. 1A) and second antenna trace 126 of antenna 100 may be the same material or distinct materials.

As shown in FIG. 1B, first contact line 128 may include an end 136 positioned opposite first contact pad 130, and second contact line 132 may include an end 138 positioned opposite second contact pad 134. As discussed herein, end 136 of first contact line 128 may be in substantial alignment with first end 116 of first antenna trace 112 (see, FIG. 1A) through sapphire structure 102. Additionally, end 138 of second contact line 132 may be in substantial alignment with second end 118 of first antenna trace 112 (see, FIG. 1A) through sapphire structure 102, as discussed herein.

Figure 2:
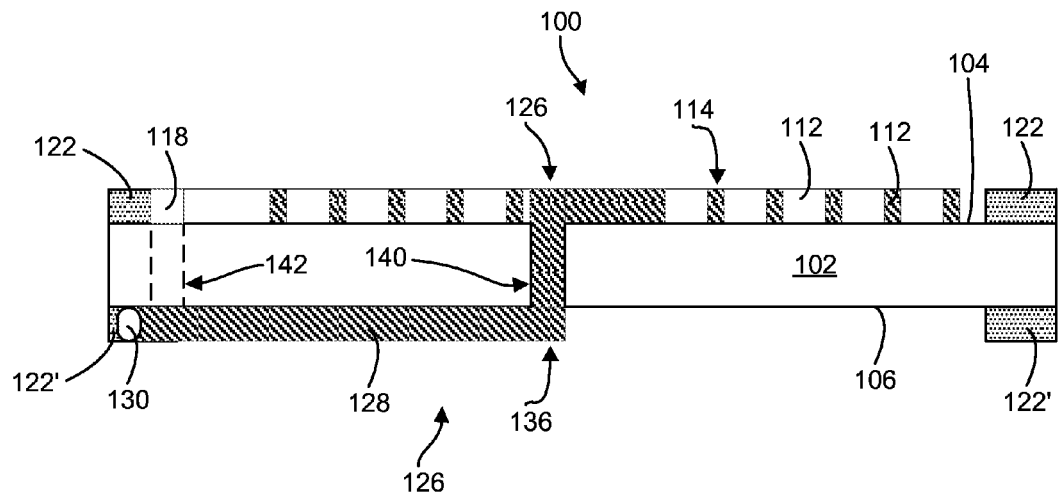
FIG. 2 shows an illustrative cross-sectional side view of the antenna of FIG. 1A along line 2-2. The antenna of FIG. 2 is formed on a sapphire structure, according to embodiments.

Turning to FIG. 2, a cross-sectional side view of sapphire structure 102 of antenna 100 along line 2-2 of FIG. 1A is shown. As shown in FIG. 2, antenna 100 may also include at least one via 140, 142 formed through sapphire structure 102. A first via 140 and a second via 142 (shown in phantom) may be formed through sapphire structure 102 to electrically couple first antenna trace 112 to second antenna trace 126. First via 140 may be formed through sapphire structure 102 to electrically couple first end 116 of first antenna trace 112 and end 136 of first contact line 128 of second antenna trace 126. That is, where first end 116 of first antenna trace 112 and end 136 of first contact line 128 of second antenna trace 126 are in substantial alignment, first via 140 may be formed through sapphire structure 102, in alignment with first end 116 and end 136, to electrically coupled first antenna trace 112 and second antenna trace 126. First via 140 may be filled with a conductive material to electrically coupled first antenna trace 112 and second antenna trace 126. More specifically, as shown in FIG. 2, first via 140 may be filled with the same conductive material used to form first antenna trace 112 and/or second antenna trace 126, to electrically couple first antenna trace 112 and second antenna trace 126.

Second via 142 (shown in phantom) may be formed through sapphire structure 102 substantially adjacent to exposed edge 120 of sapphire structure 102. More specifically, second via 142 may be formed through sapphire structure 102 to electrically couple second end 118 of first antenna trace 112 and end 138 of second contact line 132 of second antenna trace 126. End 138 of second contact line 132 may be in substantial alignment with second end 118 of first antenna trace 112. As a result, second via 142 may be formed through sapphire structure 102, in alignment with second end 118 and end 138, to electrically couple first antenna trace 112 and second antenna trace 126. As similarly discussed with respect to first via 140, second via 142 may be filled with the conductive material to electrically coupled first antenna trace 112 and second antenna trace 126.

As shown in FIG. 2, by electrically coupling first antenna trace 112 and second antenna trace 126 using vias 140, 142, first antenna trace 112 may also be electrically coupled to first contact pad 130 and second contact pad 134, respectively. That is, by electrically coupling first end 116 to end 136 using first via 140, and electrically coupling second end 118 to end 138 (see, FIG. 1B) by second via 142 (shown in phantom), first antenna trace 112 may be electrically coupled to first contact pad 130 of first contact line 128 and second contact pad 134 of second contact line 132, respectively. As discussed herein, where antenna 100 is included within an electronic device (see, FIG. 4), the electrical coupling of the first antenna trace 112 to the first contact pad 130 and the second contact pad 134, respectively, may allow antenna 100 to transmit data to/from the electronic device to/from another electronic device.

Figure 3:
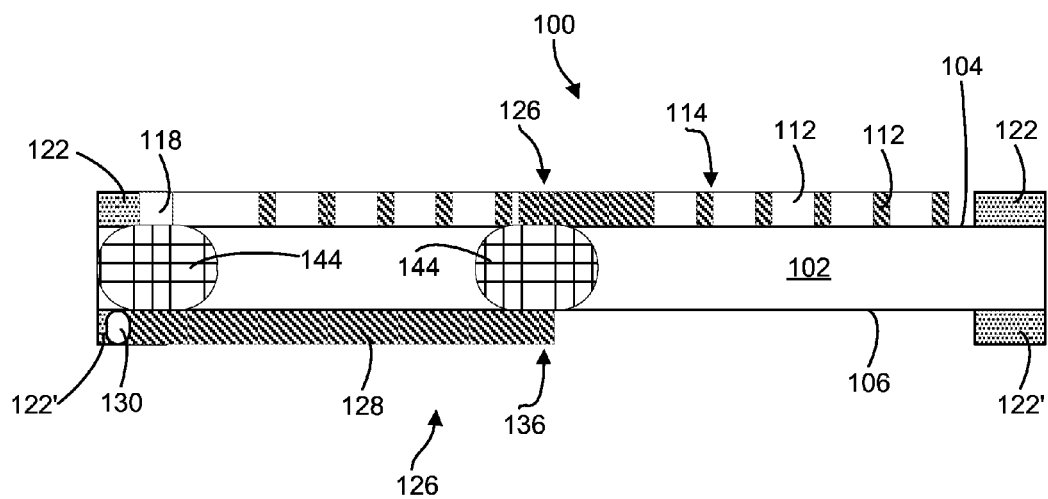
FIG. 3 shows an illustrative cross-sectional side view of an antenna formed on a sapphire structure, according to alternative embodiments.

In another embodiment, as shown in FIG. 3, antenna 100 may not include at least one via 140, 142, as discussed herein with respect to FIG. 2. It is understood that similarly numbered components may function in a substantially similar fashion. Redundant explanation of these components has been omitted for clarity. As shown in FIG. 3, at least a portion of sapphire structure 102 may be substantially doped 144. More specifically, the areas of sapphire structure 102 of antenna 100 that are positioned between the substantially aligned respective ends (e.g., first end 116, second end 118, ends 136, 138) of first antenna trace 112 and second antenna trace 126 may be substantially doped 144, to increase conductively between first antenna trace 112 and second antenna trace 126. That is, dopants may be added to sapphire structure 102 during the formation of antenna 100, as discussed herein, to dope at least a portion 144 of sapphire structure 102, such that first antenna trace 112 may be electrically coupled to second antenna trace 126 via the doped areas 144 of sapphire structure 102. End 116 of first antenna trace 112 may be electrically coupled to end 136 of first contact line 128 of second antenna trace 126 via the doped area 144 of sapphire structure 102 positioned between, and in substantial alignment with first end 116 and end 136, respectively. Additionally, second end 118 of first antenna trace 112 may be electrically coupled to end 138 of second contact line 132 of second antenna trace 126 via the doped area 144 of sapphire structure 102 positioned between, and in substantial alignment with second end 118 and end 138, respectively. It is understood that by doping at least a portion sapphire structure 102, the electrical properties of sapphire structure 102 may be substantial modified. More specifically, the doped areas 144 of sapphire structure 102 may be more electrically conductive and/or may allow electrical current to pass through sapphire structure 102 from the first antenna trace 112 to second antenna trace 126.

Figure 4:
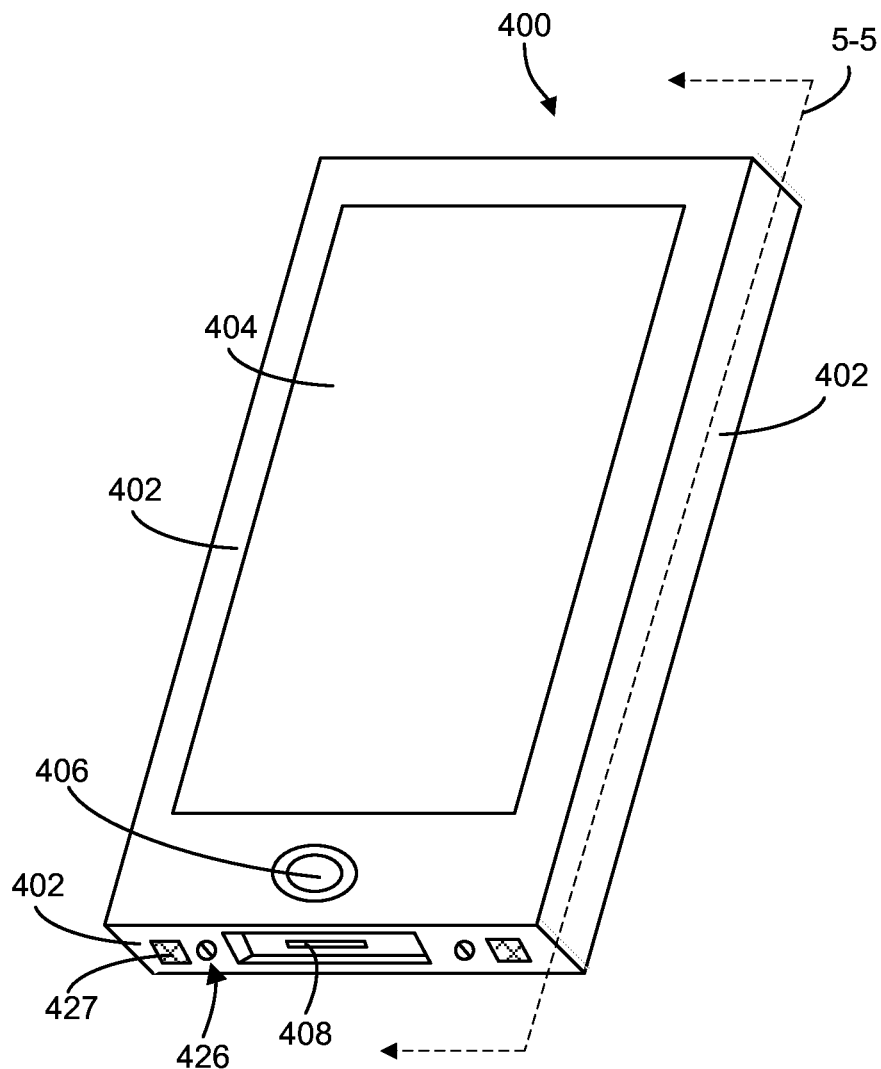
FIG. 4 shows an illustrative perspective view of an electronic device utilizing an antenna, according to embodiments.

Turning to FIG. 4, a perspective view of one example of an electronic device 400 including an antenna 100 (FIGS. 1A and 1B) is shown. In the illustrated embodiment, electronic device 400 is implemented as a smart telephone. Other embodiments can implement electronic device 400 differently, such as, for example, as a laptop or desktop computer, a tablet computing device, a gaming device, a display, a digital music player, a wearable computing device or display, a health monitoring device, and so on.

Electronic device 400 includes an enclosure 402 at least partially surrounding a display 404 and one or more buttons 406 or input devices. Enclosure 402 can form an outer surface or partial outer surface and protective case for the internal components of the electronic device 400, and may at least partially surround display 404. Enclosure 402 can be formed of one or more components operably connected together, such as a front piece and a back piece. Alternatively, enclosure 402 can be formed of a single piece operably connected to display 404. Additionally, enclosure 402 may be formed from a variety of material including, but not limited to: reinforced glass, plastic, artificially grown corundum, and any combination of material. That is, enclosure 402 may be formed from identical or substantially similar sapphire material used to form sapphire structure 102 of antenna 100 (see, FIGS. 1A and 1B).

Display 404 can be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. Button 406 can take the form of a home button, which may be a mechanical button, a soft button (e.g., a button that does not physically move but still accepts inputs), an icon or image on a display, and so on. Further, in some embodiments, button 406 can be integrated as part of a cover glass of the electronic device.

Electronic device 400 may also include a plurality of openings throughout enclosure 402. The openings in enclosure 402 of electronic device 400 may provide access from external comments of electronic device 400 to internal components. In a non-limiting example, electronic device 400 may include a battery charging port 408 included in enclosure 402. As shown in FIG. 4, battery charging port 408 may be in electronic communication with a battery 410 (see, FIG. 5) of electronic device 400 included within an internal cavity 412 (see, FIG. 5) of enclosure 402. More specifically, battery charging port 408 may include an aperture formed in enclosure 402, configured to receive a portion of a charging device (not shown) for charging battery 410. That is, battery charging port 408 positioned on the exterior of enclosure 402 may be coupled to a charging device, such that the charging device may provide an electric current to electronic device 400 to substantially charge battery 410 positioned within enclosure 402.

Figure 5:
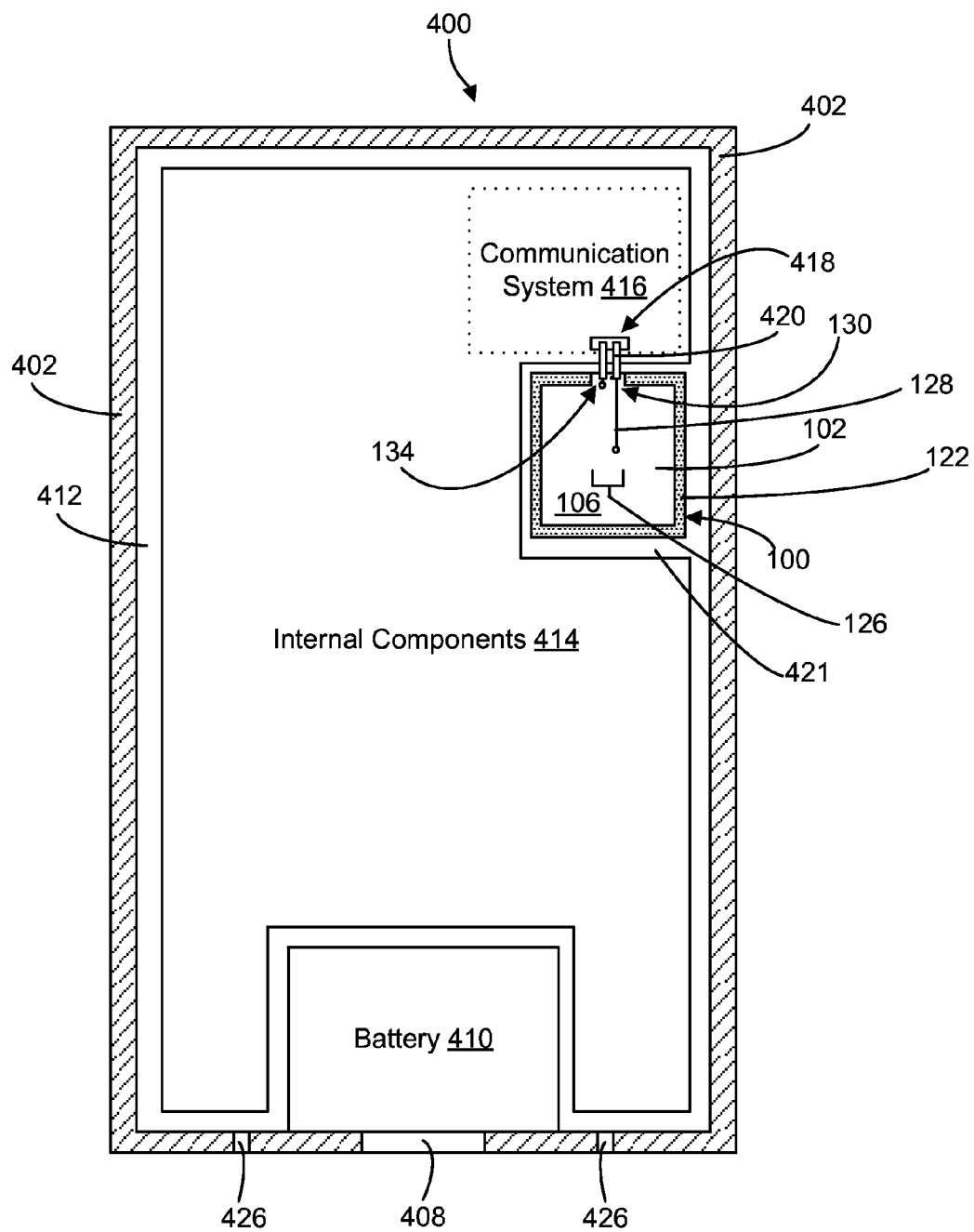
FIG. 5 shows an illustrative cross-sectional plane view of the electronic device of FIG. 4 along line 5-5. The electronic device in FIG. 5 includes an antenna, according to embodiments.

FIG. 5 shows a cross-sectional plane view of electronic device 400 along line 5-5. As shown in FIG. 5, enclosure 402 of electronic device 400 may substantially surround internal cavity 412 of electronic device 400. As discussed herein, internal cavity 412 of enclosure 402 may include battery 410 in electronic communication with battery charging port 408 of electronic device 400. Internal cavity 412 of enclosure 402 may also include a plurality of internal components 414. More specifically, as shown in FIG. 5, electronic device 400 may include a plurality of internal component 414 that may be positioned within internal cavity 412 of enclosure 402. The plurality of internal components 414 may include various electronic components and/or systems that provide electronic device 400 with functionality. For example, as shown in FIG. 5, the plurality of internal component 414 may include a communication system 416, that may utilize antenna 100 for transmitting data of electronic device 400, as discussed herein. The plurality of internal components 414 may also include, but are not limited to: graphic card, processor(s), memory or storage device(s), and sensors.

As shown in FIG. 5, and discussed herein, electronic device 400 may include antenna 100. Antenna 100 as shown in FIG. 5, may be substantially similar to, and function similarly to antenna 100 discussed herein with respect FIGS. 1A-3. As such, redundant explanation is omitted for clarity. Antenna 100 may be coupled to enclosure 402 of electronic device 400. More specifically, antenna 100 may be positioned within and/or coupled to internal cavity 412 of enclosure 402, adjacent the plurality of internal component 414 of electronic device 400. Antenna 100, as shown in FIG. 5, may display second side 106 of sapphire structure 102 including second antenna trace 126. Second side 106 of sapphire structure 102 of antenna 100 may be positioned adjacent display 404 (FIG. 4) within internal cavity 412 based on the positioning of communication system 416 of electronic device 400. That is, second side 106 may be positioned adjacent display 404 and visible in FIG. 5, rather than first side 104 (see, FIG. 1A), based upon the connection terminals 418 of communication system 416. As shown in FIG. 5, first contact pad 130 of first contact line 128, and second contact pad 134 of second contact line 132 may be electrically coupled to connection terminals 418 of communication system 416 via a plurality of connecters 420. Antenna 100 may be in electronic communication with communication system 416 to transmit data of electronic device 400, as discussed herein. Communication system 416 may include any wireless communication that may be included in electronic device 400 for sending/receiving data including, but not limited to: a cellular communication system, a local area communication system, a Wifi system, a Bluetooth system and a near field communication (NFC) system.

Figure 6:
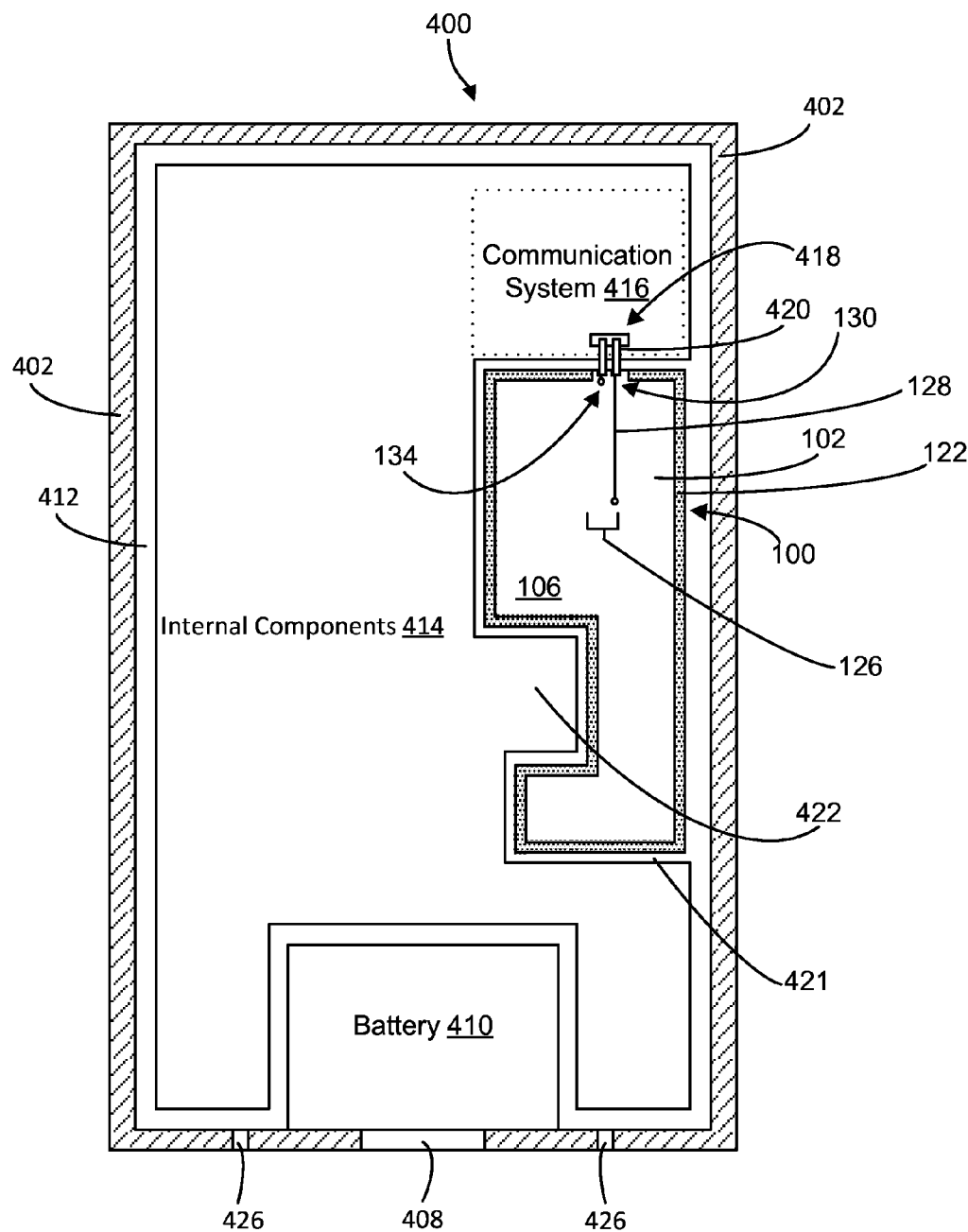
FIG. 6 shows an illustrative cross-sectional plane view of the electronic device of FIG. 4 along line 5-5. The electronic device in FIG. 6 includes an antenna, according to alternative embodiments.

Sapphire structure 102 of antenna 100 may include a configuration to fit within internal cavity 412 of enclosure 402 of electronic device 400. More specifically, as shown in FIG. 5, sapphire structure 102 of antenna may include a configuration or shape that may be positioned within a void 421 within internal cavity 412. Void 421 may include an unoccupied space within internal cavity 412 that does not include a portion of the plurality of internal components 414 of electronic device 400. As a result, sapphire structure's 102 configuration or shape may be dependent upon the size of internal cavity 412 and/or the positioning of the plurality of internal components 414 within internal cavity 412 of enclosure 402. Because sapphire structure's 102 configuration is dependent on the shape/size of internal cavity 412 and/or the plurality of internal components 414, sapphire structure 102 of antenna 100 may be substantially customizable and/or may be installed within electronic device 400 subsequent to the installation of the plurality of internal components 414. The configuration dependency and/or customizable option of sapphire structure 102 of antenna 100 may enable antenna 100 to include a large sapphire structure 102, and/or larger first antenna trace 112 and second antenna trace 126, which may ultimately increase the strength of antenna 100. In a non-limiting example, as shown in FIG. 6, sapphire structure 102 may include a substantially polygonal configuration or shape that may fit within void 421 of internal component 414. More specifically, sapphire structure 102, may include a non-uniform configuration, that may be positioned within void 421 and may be substantially surround by protrusion 422 formed by the plurality of internal components 414 positioned within internal cavity 412 of enclosure 402.

Figure 7A:
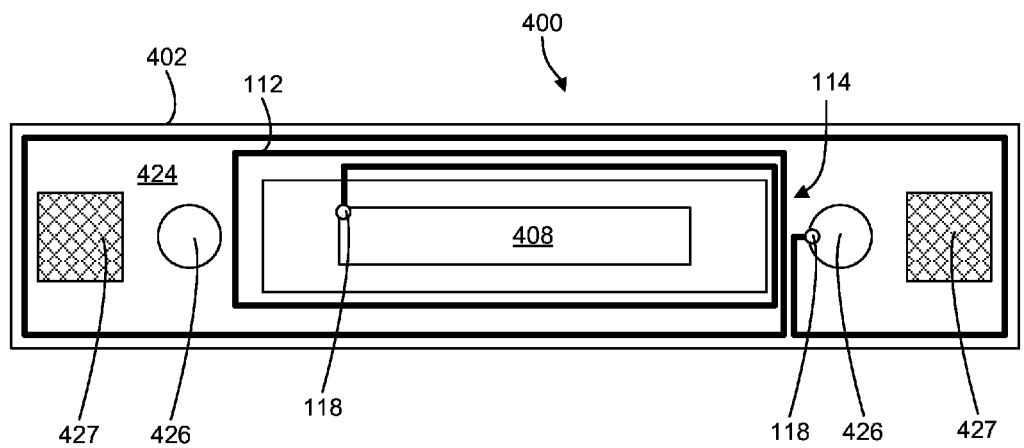
FIG. 7A shows an illustrative front view of the electronic device of FIG. 4. The electronic device in FIG. 7A includes a portion of an antenna, according to embodiments.

FIG. 7A shows a front view of a portion of electronic device 400 including battery charging port 408 and a portion of antenna 100. As discussed herein, enclosure 402 of electronic device 400 may be made from the same sapphire material (e.g., artificially grown corundum) used to form sapphire structure 102 of antenna 100. Where enclosure 402 is made from a sapphire material, as shown in FIG. 7A, enclosure 402 may include an outer surface or protective case for electronic device 400, and may also provide the sapphire structure 102 (FIGS. 1A-3) for antenna 100. In an embodiment where enclosure 402 is made from sapphire material and provides sapphire structure 102 for antenna 100, a portion of antenna 100 may be positioned on enclosure 402 of electronic device 400. More specifically, as shown in FIG. 7A, first antenna trace 112 of antenna 100 may be positioned on an exterior surface 424 of enclosure 402. Exterior surface 424 of enclosure 402 may be substantially similar to first side 104 of sapphire structure 102, as discussed herein with respect to FIG. 1A. As shown in FIG. 7A, first antenna trace 112 may include multi-loop pattern 114 that may be formed on exterior surface 424 around the openings formed through enclosure 402. That is, first antenna trace 112 may be formed on exterior surface 424 around battery charging port 408 and additional openings, including connection aperture 426, and speaker/microphone aperture 427 formed through enclosure 402. Connection aperture 426 may include an aperture or hole formed through enclosure 402 and configured to receive a fastening component (not shown) to coupled enclosure 402 to internal component 414 and/or couple the various components forming enclosure 402.

Antenna 100 may utilize openings (e.g., battery charging port 408, connection aperture 426) formed in enclosure 402 to act as vias 140, 142 (see, FIG. 2) for connecting first antenna trace 112 to second antenna trace 126. That is, where a portion of antenna 100 is formed on exterior surface 424 of electronic device 400, antenna 100 may utilize pre-existing openings formed in enclosure 402 for distinct purposes (e.g., charge battery) to also act or be configured as vias for electrically connecting first antenna trace 112 to second antenna trace 126. As shown in FIG. 7A, first end 116 of first antenna trace 112 may be positioned within a portion of connection aperture 426. That is, first end 116 of first antenna trace 112 may be in alignment with connection aperture 426 formed in enclosure 402. Additionally, as shown in FIG. 7A, second end 118 of first antenna trace 112 may be positioned within a portion of battery charging port 408 of electronic device 400. More specifically, as shown in FIG. 7A, second end 118 may be in alignment with a portion of battery charging port 408 formed in enclosure 402. Each of the respective openings (e.g., battery charging port 408, connection aperture 426) formed through enclosure 402 of electronic device 400 may include conductive material formed in the portion of the opening in alignment with the respective ends (e.g., first end 116, second end 118). The conductive material in the respective openings of enclosure 402 may be substantially similar to the conductive material positioned within vias 140, 142, as discussed herein with respect to FIG. 2. That is, connection aperture 426 may include conductive material, similar to the conductive material of first antenna trace 112, positioned through the portion of connection aperture 426 in alignment with first end 116 of first antenna trace 112, and end 136 of first contact line 128 of second antenna trace 126, as discussed herein. Additionally, the portion of battery charging port 408 in alignment with second end 118 of first antenna trace 112 and end 138 of second contact line 132 of second antenna trace 126 may include the conductive material. As similarly discussed herein with respect to FIG. 2, the conductive material in battery charging portion 408 and connection aperture 426, respectively, may electrically couple first antenna trace 112 positioned on exterior surface 424 of enclosure 402 and second antenna trace 126 positioned within internal cavity 412 (see, FIG. 7B). It is understood that the conductive material positioned within the respective openings (e.g., battery charging port 408, connection aperture 426) formed through enclosure 402 of electronic device 400 may not substantially obstruct the primary function of the openings. That is, the conductive material may only be positioned on a portion of the sidewalls of the respective openings, enough to electrically coupled first antenna trace 112 and second antenna trace 126, without interfering with the function of the openings with respect to electronic device 400.

It is understood that the multi-loop pattern 114 of first antenna trace 112 formed on enclosure 402 may include any pattern that forms a continuous trace of conductive material between first end 116 and second end 118. That is, first antenna trace 112 may include multi-loop pattern 114 that may include any customizable configuration or shape for providing an antenna trace for antenna 100. In another exemplary embodiment, multi-loop pattern 114 of first antenna trace 112 may include a pattern substantially similar to a logo or brand mark of the manufacturer or seller of electronic device 400.

Figure 7B:
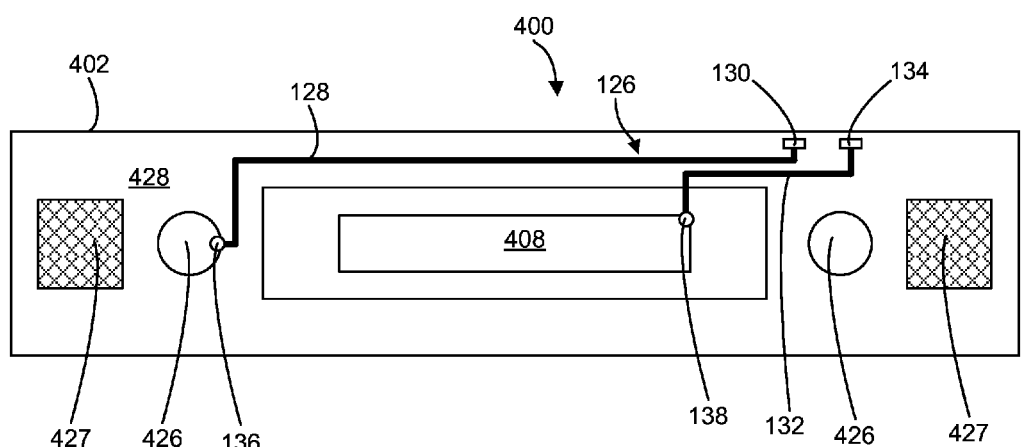
FIG. 7B shows an illustrative back view of an interior surface of the electronic device of FIG. 4. The electronic device in FIG. 7B includes a portion of an antenna, according to embodiments.

FIG. 7B shows a back view of the portion of electronic device 400 including battery charging port 408, as shown in FIG. 7A. That is, FIG. 7B may shows an interior surface 428 of a portion of enclosure 402 of electronic device 400, positioned adjacent internal cavity 412 of enclosure 402 (see, FIG. 5). Interior surface 428 may be opposite exterior surface 424 of enclosure 402 (see, FIG. 7A). As shown in FIG. 7B, second antenna trace 126 may be positioned on interior surface 428 of enclosure 402. More specifically, interior surface 428 may include first contact line 128 including first contact pad 130 and end 136, second contact line 132 including second contact pad 134 and end 138. Where enclosure 402 may be formed from a sapphire material, interior surface 428 may be substantially similar to second side 106 of sapphire structure 102 of antenna 100, as discussed above with respect to FIG. 1B.

As shown in FIG. 7B, end 136 of first contact line 128 may be positioned within a portion of connection aperture 426, and may be substantially aligned with first end 116 of first antenna trace 112 (see, FIG. 7A). That is, end 136 of first contact line 128 positioned on interior surface 428 may be substantially in alignment with first end 116, and may be electrically coupled to first antenna trace 112 via the conductive material positioned within connection aperture 426, as discussed herein. Additionally, end 138 of second contact line 132 may be positioned within a portion of battery charging port 408, and may be substantially aligned with second end 118 of first antenna trace 112 (see, FIG. 7A). That is, end 138 of second contact line 132 positioned on interior surface 428 may be substantially in alignment with second end 118, and may be electrically coupled to first antenna trace 112 via the conductive material positioned within battery charging port 408.

By utilizing existing openings (e.g., battery charging port 408, connection aperture 426) formed in enclosure 402, antenna 100 may be included on exterior surface 424 of enclosure 402 without requiring additional holes to be formed in enclosure 402 of electronic device 400. That is, antenna 100 may utilize existing openings in enclosure 402 to perform the primary function of electronic device 400, and the openings may also include conductive material for electrically coupling first antenna trace 112 to second antenna trace 126 of antenna 100, without forming openings specific to antenna 100. With less openings in enclosure 402 of electronic device 400, electronic device 400 may substantially less susceptible to damage caused by contaminants (e.g., liquids, dust, etc.) entering internal cavity 412 via the openings.

Figure 8:
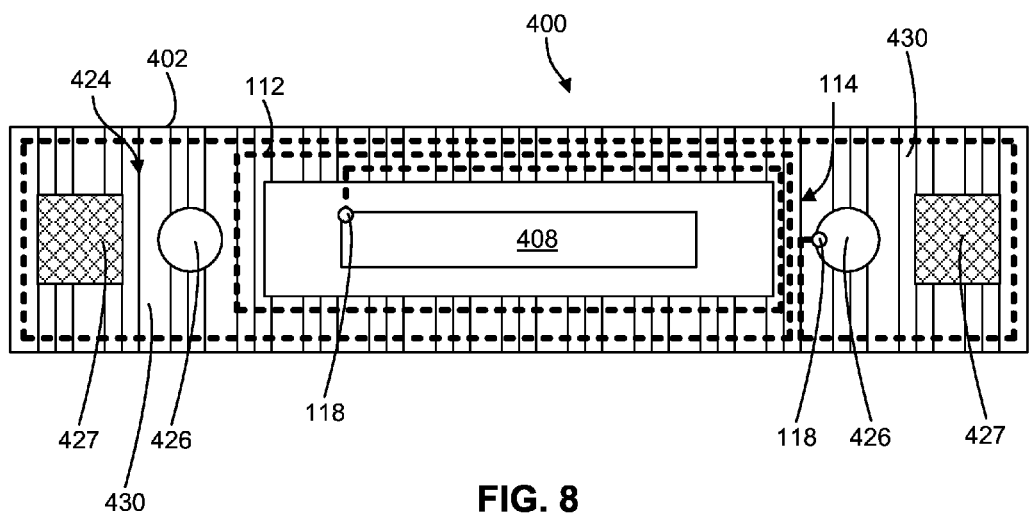
FIG. 8 shows an illustrative front view of the electronic device of FIG. 4. The electronic device in FIG. 8 includes a portion of an antenna covered by a decorative layer, according to embodiments.

Turning to FIG. 8, a front view of a portion of electronic device 400 including battery charging port 408 and a portion of antenna 100 is shown. As shown in FIG. 8, first antenna trace 112 (shown in phantom) of antenna 100 may be positioned on exterior surface 424 of enclosure 402, as discussed herein with respect to FIG. 7A. Additionally, as shown in FIG. 8, enclosure 402 may include a decorative layer 430 applied to exterior surface 424 of enclosure 402 including first antenna trace 112 of antenna 100. Decorative layer 430 may be deposited on enclosure 402 including first antenna trace 112 of antenna 100 to substantially coat enclosure 402 in a uniform material. The decorative layer 430 may also substantially cover first antenna trace 112 of antenna 100 positioned on enclosure 402 to hide or prevent first antenna trace 112 from being visible to a user of electronic device 400. Decorative layer 430 may include any conventional material that be substantially opaque and substantially heat resistant including, but not limited to: paint, ink, polymer sticker, etc.

Figure 9:
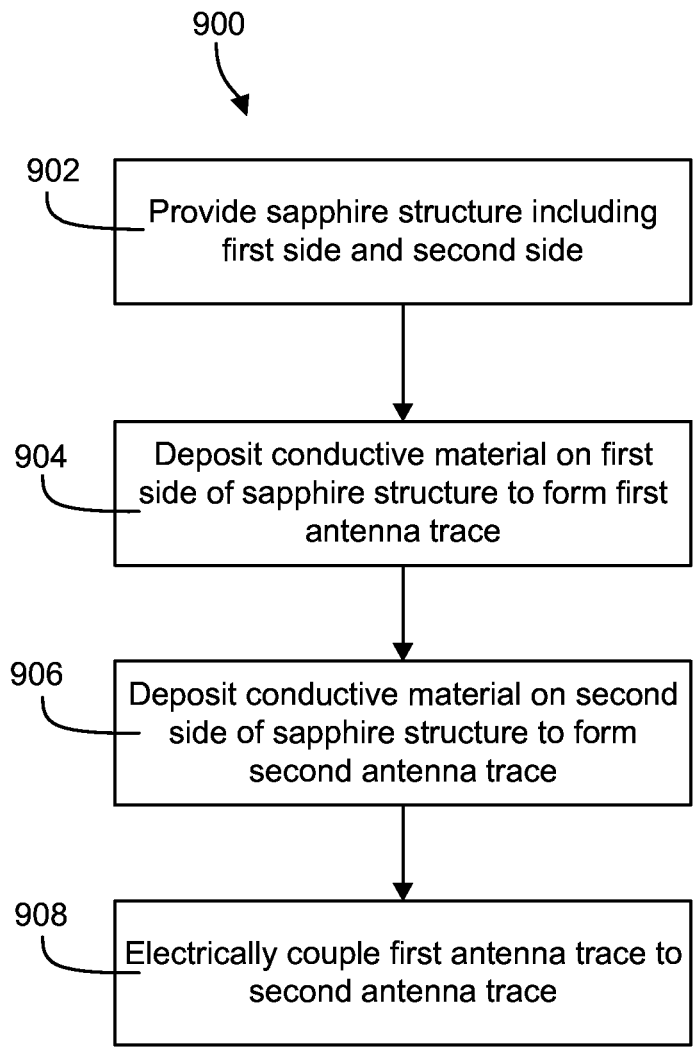
FIG. 9 shows a flow chart illustrating a method for forming an antenna on a sapphire structure. This method may be performed on the antenna including the sapphire structure as shown in FIGS. 1A-3.

Turning to FIG. 9, a method for forming an antenna 100 on a sapphire structure 102 (see, FIGS. 1A-3) is now discussed. Specifically, FIG. 9 is a flowchart depicting one sample method 900 for forming antenna 100 on sapphire structure 102 as discussed herein with respect to FIGS. 1A-3.

In operation 902, a sapphire structure may be provided. The sapphire structure provided may include a first side, and a second side positioned opposite to the first side. As discussed herein, the provided sapphire structure may include a customized or unique shape or configuration. The configuration or shape of the provided sapphire structure may be dependent upon the dimensions of the space within an electronic device which the antenna may be positioned and/or the size of the components positioned adjacent the antenna within the electronic device.

In operation 904, a conductive material may be deposited on the first side of the sapphire structure to form a first antenna trace. The conductive material may be deposited directly on the first side of the sapphire structure without an intermediate layer. The depositing of the conductive material on the first side may be performed using a plurality of deposition techniques. More specifically, the depositing of the conductive material may include, but is not limited to: screen printing the conductive material on the first side of the sapphire structure, sputtering the conductive material on the first side of the sapphire structure, etching the conductive material on the first side of the sapphire structure, or any combination of deposition techniques discussed herein. The depositing of the conductive material to form the first antenna trace may also include patterning the deposited conductive material. As discussed herein, the first antenna trace may include a multi-loop pattern formed on the first side of the sapphire structure. The multi-loop pattern of the first antenna trace may be formed by performing a patterning process on the conductive material deposited on the first side of the sapphire structure for the antenna. In a non-limiting example, the patterning process may include performing a photolithography process on the first side of the sapphire structure using a photomask which includes the multi-loop pattern of the first antenna trace.

In operation 906, a conductive material may be deposited on the second side of the sapphire structure to form a second antenna trace. The conductive material may be deposited directly on the second side of the sapphire structure using similar deposition techniques discussed above with respect to operation 904. The depositing of the conductive material to form the second antenna trace may include depositing the conductive material to form a first contact line and a second contact line. More specifically, operation 906 may include depositing the conductive material to form the first contact line that may include: an end in substantial alignment with a first end of the first antenna trace, and a first contact pad that may electrically couple the antenna with a communication system utilizing the antenna, as discussed herein. Additionally, operation 906 may include depositing the conductive material to form the second contact line that may include: an end in substantial alignment with a second end of the first antenna trace, and a second contact pad that may also electrically couple the antenna with the communication system utilizing the antenna, as discussed herein.

Intermediate steps may also be performed in forming an antenna using the sample method 900 as depicted in FIG. 9. For example, the intermediate steps of depositing a ground element to the first side and the second side of the sapphire structure may be performed. More specifically, a first ground element may be deposited on the first side of the sapphire structure, adjacent the first antenna trace, and a second ground element may be deposited on the second side of the sapphire structure, adjacent the second antenna trace. The depositing of the first ground element and second ground element may be performed before or after operation 904 and/or operation 906. That is, the depositing of the first ground element may be performed before or after the depositing of the conductive material on the first side and/or the depositing of the conductive material on the second side. Additionally, the depositing of the second ground element may be performed before or after the depositing of the conductive material on the second side and/or the depositing of the conductive material on the second side.

In operation 908, the first antenna trace of the sapphire structure may be electrically coupled to the second antenna trace of the sapphire structure. More specifically, the first antenna trace formed on the first side of the sapphire structure may be in electronic communication with the second antenna trace formed on the second side of the sapphire structure, opposite the first side. The electrical coupling of the first antenna trace and the second antenna trace may allow the antenna to transmit data to and from the electronic device utilizing the antenna and respective communication systems, as discussed herein.

The electrical coupling of the first antenna trace and the second antenna trace in operation 908 may include a plurality of distinct processes and configurations for the antenna. In an embodiment, the electrical coupling of the first antenna trace to the second antenna trace in operation 908 may also include forming at least one via through the sapphire structure of the antenna and depositing a conductive material into the at least one via. The forming of the via and the depositing of the conductive material into the via may be performed before or after operations 904 and/or 906. As discussed herein, two vias may be formed through the sapphire structure, and each via may be formed in substantially alignment with the actual or anticipated ends of the respective first antenna trace and the second antenna trace. Additionally, as discussed herein, the depositing of the conductive material into the vias that may be in substantial alignment with the ends of the respective first antenna trace and the second antenna trace may electrically couple the antenna traces of the antenna. That is, the conductive material deposited into the vias may contact both the first antenna trace and the second antenna trace and may provide an electrical connection between the first antenna trace and the second antenna trace, as discussed herein.

In an alternative embodiment, the electrical coupling in operation 908 may include doping at least a portion of the sapphire structure of the antenna. More specifically, the electrical coupling of the first antenna trace and the second antenna trace of the antenna may include: doping at least the portions of the sapphire structure positioned between the ends of the first antenna trace and the ends of the second antenna trace. As discussed herein with respect to operation 404 and operation 406, the respective ends of the second antenna trace may be in substantial alignment with the respective ends of the first antenna trace. By doping at least the portions of the sapphire structure positioned between the substantially aligned, respective ends of the first antenna trace and the second antenna trace, the sapphire structure may allow electrical communication between the first antenna trace and the second antenna trace, as discussed herein.

In utilizing a sapphire structure to form an antenna, as discussed herein, the manufacturing of the antenna may be simplified. More specifically, by including a sapphire structure in the antenna, the antenna traces may be formed directly on the sapphire structure instead of distinct components. Additionally, because of the sapphire structure's rigid structural characteristics, the overall height of the antenna may be substantially decreased. That is, only a single, thin, rigid layer of sapphire may be used to form the antenna. The decrease in height may result in additional space within the electronic device utilizing the antenna, and/or may separate the antenna further from other communication devices within the electronic device. The increased separation between the antenna and other components of the electronic device may substantially minimize the risk of antenna causing interference with other components of the electronic device. As such, the use of a ferrite material to block or protect the antenna signal may be substantially eliminated. Furthermore, as a result of the structural characteristics of the sapphire structure, the sapphire structure of the antenna may include a customized or unique shape, that may allow antenna to be placed in different portions of the electronic device and/or allow antenna to include a larger surface area for the antenna traces, without occupying additional space within the electronic device. As a result of the increased surface area for the antenna traces, the signal strength of the antenna may be increased, while the space the antenna occupies in the electronic device decreases. Finally, a portion of the antenna may be formed on the exterior surface of the electronic device, where the electronic device includes a sapphire structure. The antenna formed on the exterior surface of the electronic device may utilize openings formed in the electronic device for distinct functions other than the functions of the antenna. As such, the antenna including a portion formed on the exterior surface of the electronic device may not create more openings within the electronic device, while providing a stronger antenna signal for the electronic device.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. An electronic device comprising:
    an enclosure;
    a display positioned at least partially within the enclosure;
    a communication system positioned within the enclosure
    a sapphire structure positioned above the display and comprising;
        an antenna positioned on a side of the sapphire structure facing the display, the antenna operatively coupled to the communication system; and
        a decorative layer formed on the side of the sapphire structure.

2. The electronic device of claim 1, wherein the sapphire structure includes at least two sidewalls having a C-plane crystallographic plane orientation.

3. The electronic device of claim 1, wherein the side of the sapphire structure has an M-plane crystallographic plane orientation.

4. The electronic device of claim 1, wherein the antenna includes a loop pattern.

5. The electronic device of claim 4, wherein the antenna includes:
    a first contact line including a first contact pad; and
    a second contact line including a second contact pad, the second contact line distinct from the first contact line.

6. The electronic device of claim 5, wherein the antenna is operatively coupled to the communication system by the first and second contact pads.

7. The electronic device of claim 1, further comprising a grounding layer positioned proximate to the antenna.

8. An electronic device comprising:
    an enclosure formed from a conductive material and defining an opening;
    a sapphire structure positioned over the opening; and
    an antenna coupled to the sapphire structure on a surface that faces the enclosure; and
    an ink layer deposited on the sapphire structure in a region proximate to the antenna.

9. The electronic device of claim 8, wherein the antenna is a trace formed on the surface of the sapphire structure.

10. The electronic device of claim 8, wherein the enclosure includes multiple internal components positioned within an internal cavity of the enclosure.

11. The electronic device of claim 10, further comprising a display positioned within the opening of the enclosure.

12. The electronic device of claim 10, wherein the ink layer masks the antenna and a window aligned with an internal component of the electronic device.

13. The electronic device of claim 10, wherein the multiple internal components includes a communication system that is operatively coupled to the antenna.

14. The electronic device of claim 13, wherein the communication system includes a wireless communication system configured to send and receive data.

15. The electronic device of claim 8, wherein the antenna is a trace formed on the surface of the sapphire structure.

16. A method of forming an antenna on a sapphire structure, the method comprising:
    depositing a conductive material on a side of the sapphire structure to form the antenna; and
    depositing a decorative layer on the side of the sapphire structure in a region proximate to the antenna.

17. The method of claim 16, further comprising:
    depositing a ground element on the side of the sapphire structure, adjacent the antenna.

18. The method of claim 16, wherein the depositing of the conductive material on the side of the sapphire structure includes one of:
    screen printing the conductive material on the side of the sapphire structure,
    sputtering the conductive material on the side of the sapphire structure, or
    etching the conductive material on the side of the sapphire structure.

19. The method of claim 16, further comprising patterning the deposited conductive material to form an antenna trace on the side of the sapphire structure.

* * * * *